United States Patent
Wargo et al.

(10) Patent No.: US 10,347,961 B2
(45) Date of Patent: Jul. 9, 2019

(54) RADIO FREQUENCY INTERCONNECT SYSTEMS AND METHODS

(71) Applicant: Raytheon Company, Waltham, MA (US)

(72) Inventors: Matthew J. Wargo, Tucson, AZ (US); Joseph M. Anderson, Tucson, AZ (US); Kelly Ryian Stewart, Tucson, AZ (US); Matthew Salem, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 35 days.

(21) Appl. No.: 15/334,738

(22) Filed: Oct. 26, 2016

(65) Prior Publication Data

US 2018/0115074 A1   Apr. 26, 2018

(51) Int. Cl.
*H01P 5/00*   (2006.01)
*H01P 5/02*   (2006.01)
(Continued)

(52) U.S. Cl.
CPC .............. *H01P 5/028* (2013.01); *H01P 1/042* (2013.01); *H01P 1/047* (2013.01); *H01P 3/084* (2013.01);
(Continued)

(58) Field of Classification Search
CPC .. H01P 5/00; H01P 5/028; H01P 1/047; H01P 3/087; H01P 3/084; H01P 1/042;
(Continued)

(56) References Cited

U.S. PATENT DOCUMENTS 3,230,483 A * 1/1966 Kinsey ................. H01P 5/181
                                              333/114
3,825,863 A * 7/1974 Meier ................... H01P 3/123
                                              333/239
(Continued)

FOREIGN PATENT DOCUMENTS

WO    WO 2007/036607 A1    4/2007
WO    WO 2007036607 A1 *   4/2007    ............. H01P 3/081

OTHER PUBLICATIONS

Bialkowski, et al.; "Reflectarrays: Potentials and Challenges"; International Conference on Electromagnetics in Advanced Applications, 2007; Sep. 17-21, 2007; 4 Pages.
(Continued)

*Primary Examiner* — Dameon E Levi
*Assistant Examiner* — Ab Salam Alkassim, Jr.
(74) *Attorney, Agent, or Firm* — Daly, Crowley, Mofford & Durkee, LLP

(57) ABSTRACT

The concepts, systems and methods described herein are directed towards a connectorless radio frequency (RF) interface between an antenna and RF processor. An RF interconnect is provided having a housing having a ridged waveguide portion provided therein, an upper cavity formed in an upper portion of the housing, a lower cavity formed in a lower portion of the housing, a first suspended air stripline (SAS) transmission line disposed in the lower cavity such that at least a portion of the first SAS transmission line crossed a slot formed by the ridged waveguide and a second SAS transmission line disposed in the upper cavity such that at least a portion of the second SAS transmission line crosses the slot formed by the ridged waveguide.

17 Claims, 5 Drawing Sheets

(51) Int. Cl.
  *H05K 9/00*  (2006.01)
  *H01P 3/08*  (2006.01)
  *H01P 3/13*  (2006.01)
  *H01P 1/04*  (2006.01)
  *H01P 3/12*  (2006.01)
(52) U.S. Cl.
  CPC ............... H01P 3/087 (2013.01); H01P 3/12 (2013.01); H01P 3/13 (2013.01); H05K 9/00 (2013.01)
(58) Field of Classification Search
  CPC .... H01P 5/082; H01P 3/12; H01P 3/13; H01P 3/14; H01C 13/0233; H01Q 13/0233; H05K 9/00
  See application file for complete search history.

(56) References Cited

U.S. PATENT DOCUMENTS

| | | | | |
|---|---|---|---|---|
| 4,208,642 | A * | 6/1980 | Saunders | H01P 1/047 333/246 |
| 4,434,541 | A * | 3/1984 | Powers, Jr. | C08K 3/08 174/390 |
| 4,734,140 | A * | 3/1988 | Tzeng | H05K 9/0015 148/513 |
| 4,932,673 | A * | 6/1990 | Domnikov | H01P 1/042 174/366 |
| 5,471,181 | A * | 11/1995 | Park | H01P 5/028 333/246 |
| 5,712,607 | A * | 1/1998 | Dittmer | H01P 3/087 333/238 |
| 5,765,835 | A * | 6/1998 | Johnson | F16J 15/064 277/314 |
| 6,052,889 | A * | 4/2000 | Yu | H01Q 1/36 29/600 |
| 6,545,572 | B1 * | 4/2003 | Ohta | H01P 5/028 333/246 |
| 7,280,010 | B2 | 10/2007 | Buer et al. | |
| 9,397,381 | B2 * | 7/2016 | Kondou | H01P 5/028 |
| 9,408,306 | B2 * | 8/2016 | Wang | H05K 1/14 |
| 9,698,458 | B2 * | 7/2017 | Stratis | H01P 3/087 |
| 10,114,040 | B1 * | 10/2018 | Jordan | G01R 31/00 |
| 2003/0067410 | A1 * | 4/2003 | Puzella | H01Q 9/0407 343/700 MS |
| 2003/0107451 | A1 * | 6/2003 | Park | H01P 1/066 333/26 |
| 2003/0112576 | A1 * | 6/2003 | Brewer | G03F 7/0002 361/119 |
| 2004/0048420 | A1 * | 3/2004 | Miller | H01P 3/084 438/127 |
| 2006/0273863 | A1 * | 12/2006 | Quan | H01P 1/227 333/81 A |
| 2007/0069839 | A1 * | 3/2007 | Pathak | H01P 5/087 333/239 |
| 2008/0088519 | A1 * | 4/2008 | Quan | H01Q 21/064 343/770 |
| 2009/0158581 | A1 * | 6/2009 | Nguyen | H05K 3/108 29/592.1 |
| 2009/0179717 | A1 * | 7/2009 | Sterns | H01P 1/218 333/209 |
| 2009/0231226 | A1 * | 9/2009 | Quan | H01Q 1/085 343/770 |
| 2011/0025429 | A1 * | 2/2011 | Syal | H01P 3/081 333/34 |
| 2011/0115578 | A1 * | 5/2011 | Quan | H01P 5/04 333/238 |
| 2012/0152454 | A1 * | 6/2012 | Mass | H01P 3/121 156/280 |
| 2012/0256794 | A1 * | 10/2012 | Veihl | H01P 5/028 343/700 MS |
| 2013/0057365 | A1 * | 3/2013 | Mizushima | H01P 1/047 333/238 |
| 2013/0241791 | A1 * | 9/2013 | Anderson | H01Q 15/008 343/848 |
| 2014/0028413 | A1 * | 1/2014 | Ishii | H01P 3/08 333/33 |
| 2016/0072190 | A1 * | 3/2016 | Merk | H01Q 1/50 343/776 |
| 2016/0240908 | A1 * | 8/2016 | Strong | H01P 5/028 |
| 2016/0286643 | A1 * | 9/2016 | Taguchi | H01P 1/207 |
| 2017/0026023 | A1 * | 1/2017 | Simon | H01P 5/10 |
| 2017/0062894 | A1 * | 3/2017 | Stratis | H01P 3/087 |
| 2017/0179562 | A1 * | 6/2017 | Stratis | H01P 3/16 |
| 2017/0229781 | A1 * | 8/2017 | Morgan | H01Q 13/0275 |

OTHER PUBLICATIONS

Chen, et al.; "Optimization of Aperture Transitions for Multiport Microstrip Circuits"; IEEE Transactions on Microwave Theory and Techniques; vol. 44, No. 12; Dec. 1996; 9 Pages.

Roasto, et al.; "EMC Considerations on PCB Design for a High-Power Converter Control System"; Compatibility in Power Electronics; May 29-Jun. 1, 2007; 4 Pages.

PCT Search Report & Written Opinion of the ISA dated Jul. 20, 2017 from International Application No. PCT/US2017/027518; 17 Pages.

* cited by examiner

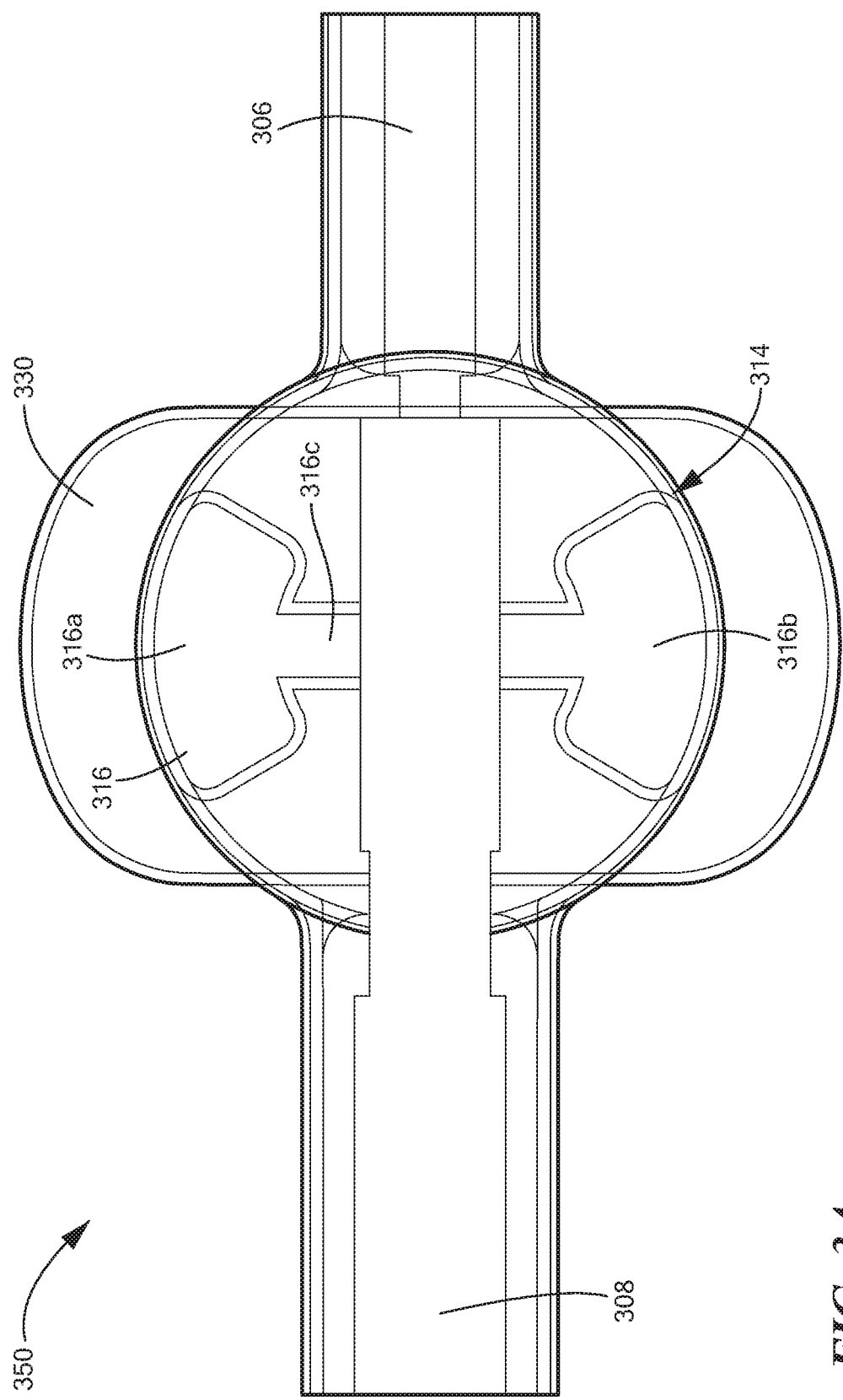

RADIO FREQUENCY INTERCONNECT SYSTEMS AND METHODS

GOVERNMENT INTERESTS

This invention was made with the government support under Contract No. N00024-15-C-5420 awarded by the U.S. Navy. The government has certain rights in this invention.

BACKGROUND

As is known in the art, an array antenna can utilize direct connections (i.e., connectors) to connect antenna elements to a receiver portion of the array antenna. For example, outputs of antenna elements can be physically connected to inputs of the receiver portion by physically mating (e.g., using plug-in type connectors or threaded connectors) two ends of a cable or connector (e.g., using plug-in type connectors or threaded connectors). However, many array antennas and radio frequency (RF) systems have limited size constraints, power handling requirements and weight allowances. These size, power and weight constraints make it difficult to utilize conventional physical connections between the antenna elements and receiver portion of an array antenna.

SUMMARY

The concepts, systems and methods described herein are directed towards a connectorless interface for coupling radio frequency (RF) signals between components such as between an antenna and RF processor. In an embodiment, an RF interconnect system is provided having suspended air stripline (SAS) transmission media on both an antenna portion and a receiver portion. The RF interconnect includes a slot formed by a ridged waveguide. At least a portion of the SAS transmission media of both the antenna portion and receiver portion cross the slot such that energy can be coupled between the antenna portion and receiver portion through the slot. Thus, the RF interconnect structures and techniques described herein result in a connectorless interface having no physical connections (e.g., no threaded connectors or plug-ins or pins) between mating halves of an antenna portion and a receiver for example.

The RF interconnect includes two cavity portions, each having an SAS transmission line disposed or otherwise formed within. One cavity portion is disposed on a first component or circuit portion and the other cavity portion is disposed on a second component or circuit portion. In one embodiment, for example, one cavity portion is disposed on an antenna and a second cavity portion is disposed on a receiver portion of an array antenna. A ridged waveguide structure having a slot provided therein is disposed between the two cavity portions. At least a portion of the SAS transmission lines may be disposed such that they cross the slot formed by the waveguide structure. The slot may be provided as a dogbone shaped slot and RF energy may be transferred between the SAS transmission lines through the dogbone shaped slot. In some embodiments, the slot may be sealed, for example, using an electromagnetic interference (EMI) gasket. As the SAS transmission lines are electromagnetically coupled through the waveguide, slot structure (instead of using physical connections such as pins), the RF interconnect systems described herein can have a lower profile (size) and increased power handling capability than systems which use physical connections such as connectors (e.g., threaded or push connectors). Thus, the RF interconnects described herein provide a connectorless interface having no physical connections in the coupling regions between mating halves in array antenna between array elements and a receiver portion.

In one aspect, a radio frequency (RF) interconnect includes a housing having a ridged waveguide portion provided therein, an upper cavity formed in an upper portion of the housing, a lower cavity formed in a lower portion of the housing, a first suspended air stripline (SAS) transmission line disposed in the lower cavity such that at least a portion of the first SAS transmission line crossed a slot formed by the ridged waveguide and a second SAS transmission line disposed in the upper cavity such that at least a portion of the second SAS transmission line crosses the slot formed by the ridged waveguide.

The RF interconnect may further comprise an electromagnetic interference (EMI) gasket disposed at an interface established between the first SAS transmission line and the second SAS transmission line. In some embodiments, the first SAS transmission line and the second SAS transmission line are separated by a predetermined distance. The slot formed by the ridged waveguide may form an electromagnetic capability (EMC) transition between the first SAS transmission line and the second SAS transmission line.

In some embodiments, the upper cavity and lower cavity may each comprise dielectric material. The dielectric material in the upper cavity may be different than the dielectric material in the lower cavity. The upper cavity and the lower cavity may each comprise one or more air gaps positioned relative to the slot formed by the ridged waveguide. A dielectric constant of the upper cavity can be equal to a dielectric constant of the lower cavity.

The first SAS transmission line and/or the second SAS transmission line may comprise a plurality of vias to form an electromagnetically thick conductor. The slot formed by the ridged waveguide may include a dog-bone slot.

In another aspect, an RF interconnect system is provided having an antenna suspended air stripline (SAS) having a first and second opposing surfaces, the second surface having a first conductor and a first cavity. The first cavity may form a first portion of a ridged waveguide. The RF interconnect system further comprises a receiver SAS having a first and second opposing surfaces, the first surface having a second conductor and a second cavity. The second cavity forms a second side of the ridged waveguide. In an embodiment, energy can be transmitted between the antenna SAS and the receiver SAS through the ridged waveguide.

An electromagnetic interference (EMI) gasket can be disposed at an interface established between the first cavity and the second cavity. The first conductor and second conductor can be separated by a predetermined distance.

In some embodiments, the coupling slot forms an electromagnetic capability (EMC) transition between the first conductor and the second conductor. The antenna SAS and receiver SAS may each comprise dielectric material. The dielectric material in the antenna SAS may be different than the dielectric material in the receiver SAS. The antenna SAS and the receiver SAS may each comprise one or more air gaps positioned relative to the ridged waveguide. In some embodiments, the second conductor of the receiver SAS comprises a plurality of vias to couple a first surface of the second conductor to a second surface of the second conductor, and thus form an electromagnetically thick conductor.

In another aspect, an RF interconnect system comprises a first substrate having first and second opposing surfaces, the first substrate having a plurality of traces disposed over different portions of the second surface and a plurality of cavities formed in the second surface. Each of the plurality of cavities form first sides of a plurality of ridged waveguides. The RF interconnect system further comprises a second substrate having first and second opposing surfaces, the second substrate having a plurality of traces disposed over different portions of the first surface and a plurality of cavities formed in the first surface. Each of the plurality of cavities form a second sides of the plurality of ridged waveguides. Energy may be coupled between the first conductor and the second conductor through the plurality of ridged waveguides. Each of the plurality of traces disposed over different portions of the second surface of the first substrate are separated by a predetermined distance from each of the plurality of traces disposed over different portions of the first surface of the second substrate.

BRIEF DESCRIPTION OF THE DRAWINGS

The foregoing concepts and features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the concepts, systems and techniques described herein. Like numbers in the figures denote like elements.

FIG. 3A is a top view of a ridged waveguide in an RF interconnect system; and

DETAILED DESCRIPTION

Figure 1:
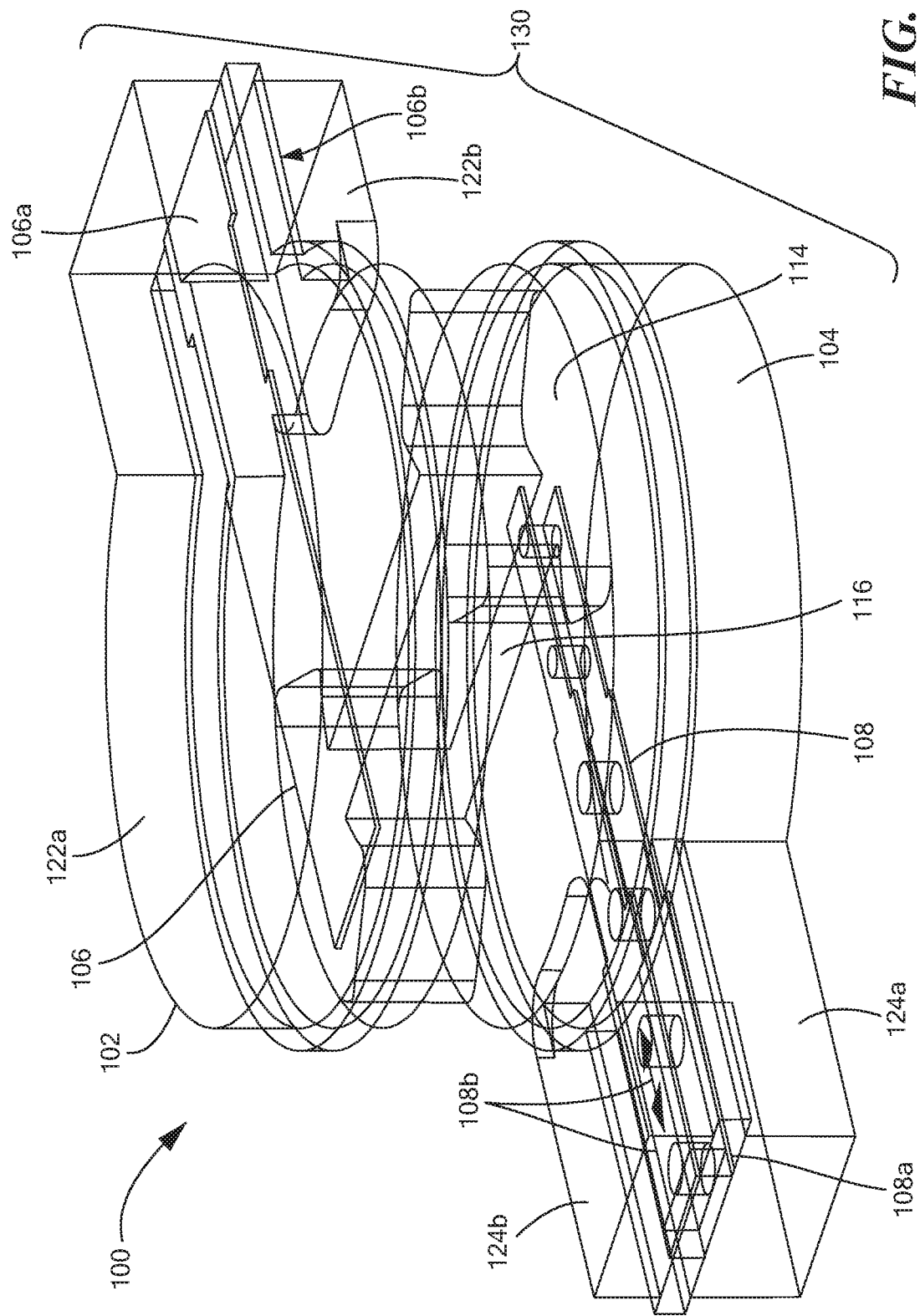
FIG. 1 is an isometric view of a radio frequency (RF) interconnect system.

Now referring to FIG. 1, a radio frequency (RF) interconnect 100 includes a housing 130 having an upper cavity 102, a lower cavity 104 and a ridged waveguide 114. A first suspended air stripline (SAS) transmission line 106 is disposed in the upper cavity 102 such that at least a portion of the first SAS transmission line crosses a slot 116 formed by the ridged waveguide 114. A second SAS transmission line 108 is disposed in the lower cavity 104 such that at least a portion of the second SAS transmission line 108 crosses the slot 116 formed by the ridged waveguide 114.

Ridged waveguide 114 is disposed between upper cavity 102 and lower cavity 104 and is configured to electrically couple RF signals between the upper and lower cavities 102, 104 through slot 116. For example, ridged waveguide 114 couples signals from upper cavity 102 to lower cavity 104 and/or receive signals from lower cavity 104 and couple the signals (e.g., transfer) to upper cavity 102. Although a ridged waveguide is described herein, it should be appreciated that in other embodiments, other types of waveguiding structures having a variety of different shapes (e.g., tubular, rectangular or circular) may be formed or otherwise disposed between upper cavity 102 and lower cavity 104 to transmit RF energy between upper cavity 102 and lower cavity 104. The shape and/or dimensions of ridged waveguide 114 may be based at least in part on a desired bandwidth range of RF interconnect 100 and/or size constraints of RF interconnect 100.

In some embodiments, ridged waveguide 114 may be formed as part of each of the upper cavity 102 and lower cavity 104. For example, a first portion of ridged waveguide 114 and slot 116 may be formed as part of (e.g., extend from) upper cavity 102. A second portion of ridged waveguide 114 and slot 116 may be formed as part of (e.g., extend from) lower cavity 104. Thus, when upper cavity 102 and lower cavity 104 are coupled together, ridged waveguide 14 and slot 116 can be formed. In such an embodiment, a gasket (not shown) may be formed on either the first or second portion of slot 116 to seal slot 116 when upper cavity 102 and lower cavity 104 are coupled together Upper cavity 102 includes open cavity regions 122a, 122b. Open cavity regions 122a, 122b may be formed such that they surround first SAS transmission line 106. For example, a first region 122a may be formed on a first side 106a of first SAS transmission line 106 and a second region 122b may be formed on a second side 106b of first SAS transmission line 106. In an embodiment, regions 122a, 122b may be air filled to form the SAS. Lower cavity 104 includes regions 124a, 124b. Regions 124a, 124b may be formed such that they surround second SAS transmission line 108. In an embodiment, regions 124a, 124b may be air filled to form the SAS. For example, a first region 124a may be formed on a first side 108a of second SAS transmission line 108 and a second region 122b may be formed on a second side 108b of second SAS transmission line 108.

In other embodiments, upper cavity 102 and lower cavity 104 may have a dielectric material disposed in all or portions thereof. A combination of dielectric material and air filled regions may be disposed around first SAS transmission line 106 and second SAS transmission line 108 respectively. For example, a conductor (not shown) may be disposed on a surface of a dielectric substrate to form the first and second transmission lines 106, 108. In some embodiments, the upper cavity 102 and lower cavity may include the same dielectric material. For example, the dielectric material in both the upper cavity 102 and lower cavity 104 may have the same dielectric constant. In other embodiments, the upper cavity 102 and lower cavity may include different dielectric material having a different dielectric constant.

First and second SAS transmission lines 106, 108 may be spaced apart from each other by a predetermined distance. The predetermined distance may be based at least in part of the dimensions of ridged waveguide 114, slot 116 and/or desired transmission qualities (e.g., bandwidth of RF energy to be transmitted between first and second SAS transmission lines 106, 108) of RF interconnect 100. In some embodiments, the predetermined distance may be based at least in part on the dimensions of the particular system (e.g., seeker antenna) RF interconnect 100 is disposed within.

Size of upper cavity 102 can be based at least in part on the size and dimensions of lower cavity 104 and vice versa. For example, upper cavity 102 may correspond to an antenna portion and lower cavity 104 may correspond to a receiver portion of an array antenna. One of the antenna portion or receiver portion may have fixed dimensions or sizing guidelines according to a particular system the array antenna is coupled to or a component of. Thus, upper cavity 102 and/or lower cavity 104 can be formed having a variety of different dimensions at least to accommodate and meet the dimensions of the other.

Figure 2:
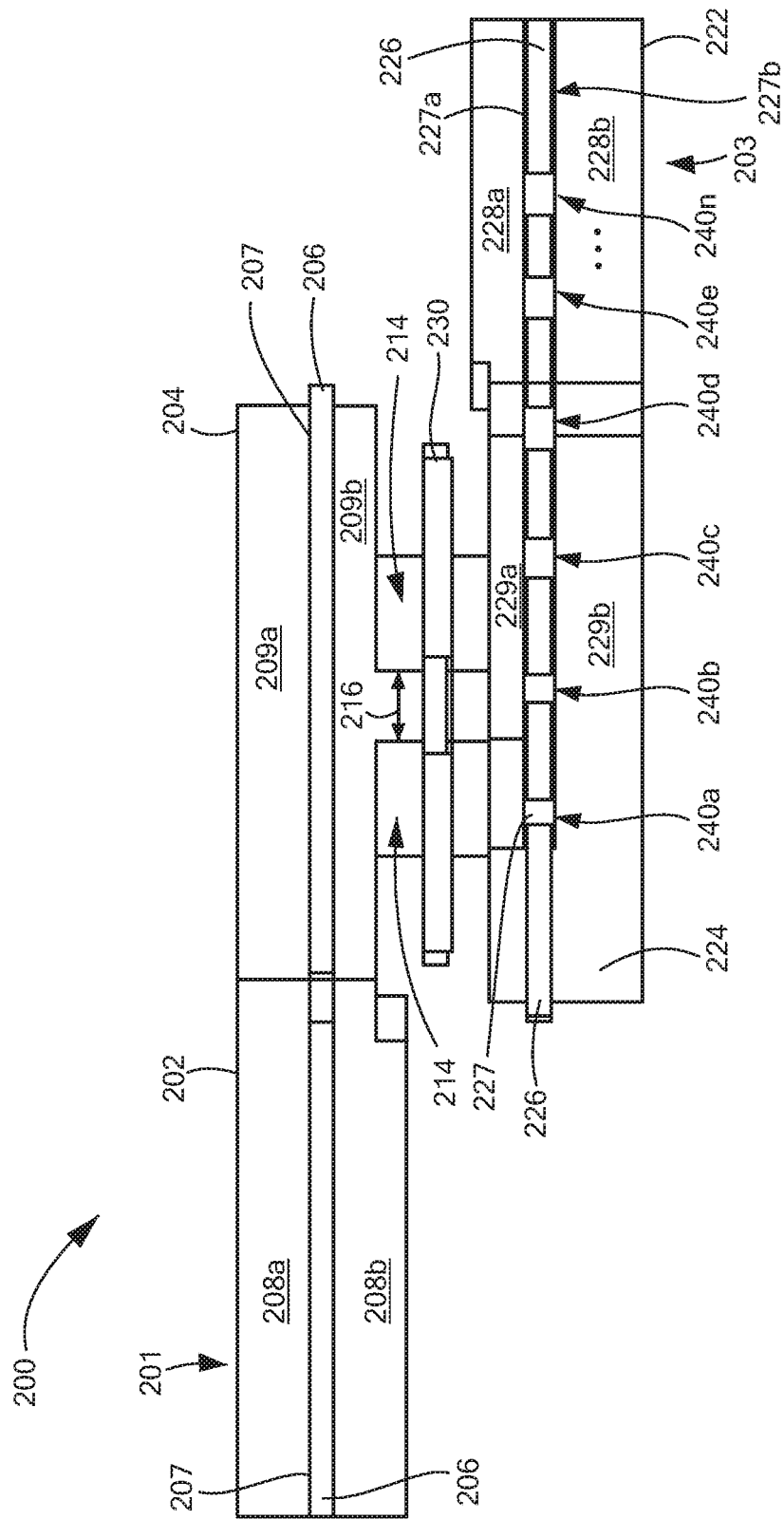
FIG. 2 is a side view of an RF interconnect system.

Now referring to FIG. 2, an RF interconnect 200 includes first and second transmission lines 201, 203, each provided as an SAS transmission line. For example, first transmission line 201 includes a substrate 206 having a conductor 207 disposed on a first surface thereof. The substrate 206 and conductor 207 are disposed in a waveguide structure 202 (here a rectangular waveguide structure) to provide the SAS transmission line 201 to an upper cavity 204. Waveguide structure 202 includes air filled regions 208a, 208b formed on both sides of the substrate 206 and conductor 207. Thus, the substrate 206 and conductor 207 can be surrounded by air to form the SAS transmission line.

A portion of the substrate 206 and conductor 207 extend into upper cavity 204. Upper cavity 204 includes air filled regions 209a, 209b formed on both sides of the substrate 206 and conductor 207. Thus, the substrate 206 and conductor 207 can be surrounded by air in upper cavity 204 to form the SAS transmission line.

Upper cavity 204 may be disposed adjacent to a ridged waveguide 214. Ridged waveguide structure 214 includes a slot 216 and a gasket 230 to seal the slot 216. In an embodiment, a portion of the SAS transmission line (i.e., a portion of substrate 206 and conductor 207) may cross slot 216.

Second transmission line provided as a SAS transmission line includes a substrate 226 having conductors 227a, 227b disposed on opposing surfaces thereof. The substrate 226 and conductors 227a, 227b are disposed in a waveguide structure 222 to provide the SAS transmission line to a lower cavity 224. Waveguide structure 222 includes air filled regions 228a, 228b formed on both sides of the substrate 226 and conductors 227a, 227b. Thus, the substrate 226 and conductors 227a, 227b can be surrounded by air to form the SAS transmission line.

A portion of the substrate 226 and conductors 227a, 227b extend into lower cavity 224. Lower cavity 224 includes air filled regions 229a, 229b formed on both sides of the substrate 226 and conductor 227. Thus, the substrate 226 and conductors 227a, 227b can be surrounded by air in lower cavity 224 to form the second SAS transmission line. In some embodiments, lower cavity 224 may be disposed such that it is opposite/adjacent to upper cavity 204 with respect to ridged waveguide 214 (here under). In an embodiment, a portion of the SAS transmission line (i.e., a portion of substrate 226 and conductors 227a, 227b) may cross slot 216.

In some embodiments, one or more vias 240a-240n can be formed though substrate 226 to electrically couple conductors 227a, 227b.

Ridged waveguide 214 may be disposed at or formed at an interface between upper cavity 204 and lower cavity 224. In an embodiment, energy (e.g., RF energy) may be coupled between upper cavity 204 and lower cavity 224 through slot 216. In an embodiment, upper cavity 202 can be electromagnetically coupled to lower cavity 204 through the ridged waveguide structure 214 and slot 216. Thus, in this manner, first and second transmission lines 201, 2003 can be electromagnetically coupled to each other.

For example, in one embodiment, upper cavity 202 may be coupled to outputs of array elements of an array antenna and lower cavity 204 may be coupled to a receiver portion of an RF processor of the array antenna. To receive signals incident on the array elements, upper cavity 202 can be configured to receive the signals from the array elements and provide the signals to lower cavity 204 though ridged waveguide structure 214 and slot 216. Alternatively, to transmit signals, lower cavity 204 can be configured to generate and provide signals to upper cavity 202 through ridged waveguide structure 214 and slot 216 and upper cavity 202 can provide them to the array elements. Thus, RF interconnect 200 can be configured for both transmit and receive functions.

As illustrated in FIG. 2, upper cavity 204 and lower cavity 224 can be positioned such that each cross at least a portion of slot 216. For example, and as illustrated in FIG. 2, upper cavity 202 and lower cavity 204 are disposed having an 180° orientation with respect to each other (e.g., clam shell arrangement) such that generally half of substrate 206 and conductor 207 are disposed over generally half of substrate 226 and conductor 227. In such an embodiment, substrate 206 and conductor 207 can be exposed to substrate 226 and conductor 227 through ridged waveguide 214 and slot 216.

It should be appreciated, however, that upper cavity 204 and lower cavity 224 may be disposed in a variety of different arrangements. For example, in some embodiments, upper cavity 204 may be disposed entirely over lower cavity 224 and first waveguide structure 202 may be disposed entirely over second waveguide structure 222, thus having a 0° orientation with respect to each other.

Slot 216 may be sealed using a conductive gasket 230 to seal the interface (e.g., ridged waveguide 214 and slot 216) between upper cavity 202 and lower cavity 204 and prevent transmission of electromagnetic interference. In some embodiments, the conductive gasket 230 may include an electromagnetic interference (EMI) gasket. In other embodiments, a conductive epoxy may be used to seal slot 216 and thus seal the interface between upper cavity 202 and lower cavity 204 and prevent transmission of electromagnetic interference.

Substrates 206, 226 may include dielectric material or other types of non-magnetic materials. For example, in some embodiments, substrates 206, 226 may include non-magnetic material such as FR-4 or a Rogers Corporation, Rogers, Conn. laminate material. Upper cavity substrate 206 and lower cavity substrate 226 may include the same material having the same dielectric constant. In other embodiments, upper cavity substrate 206 and lower cavity substrate 226 may include different material having a different dielectric constant.

Conductors 207, 227a, 227b may be provided as any type of conductive material. Conductors 207, 227a, 227b may be disposed, applied to or otherwise formed on at least one surface of upper cavity substrate 206 or lower cavity substrate 226 respectively. In some embodiments, upper cavity conductor 207 and lower cavity conductors 227a, 227b may have the same dimensions (e.g., length, width). In other embodiments, upper cavity conductor 207 and lower cavity conductors 227a, 227b may have different dimensions (e.g., length, width).

Figure 3:
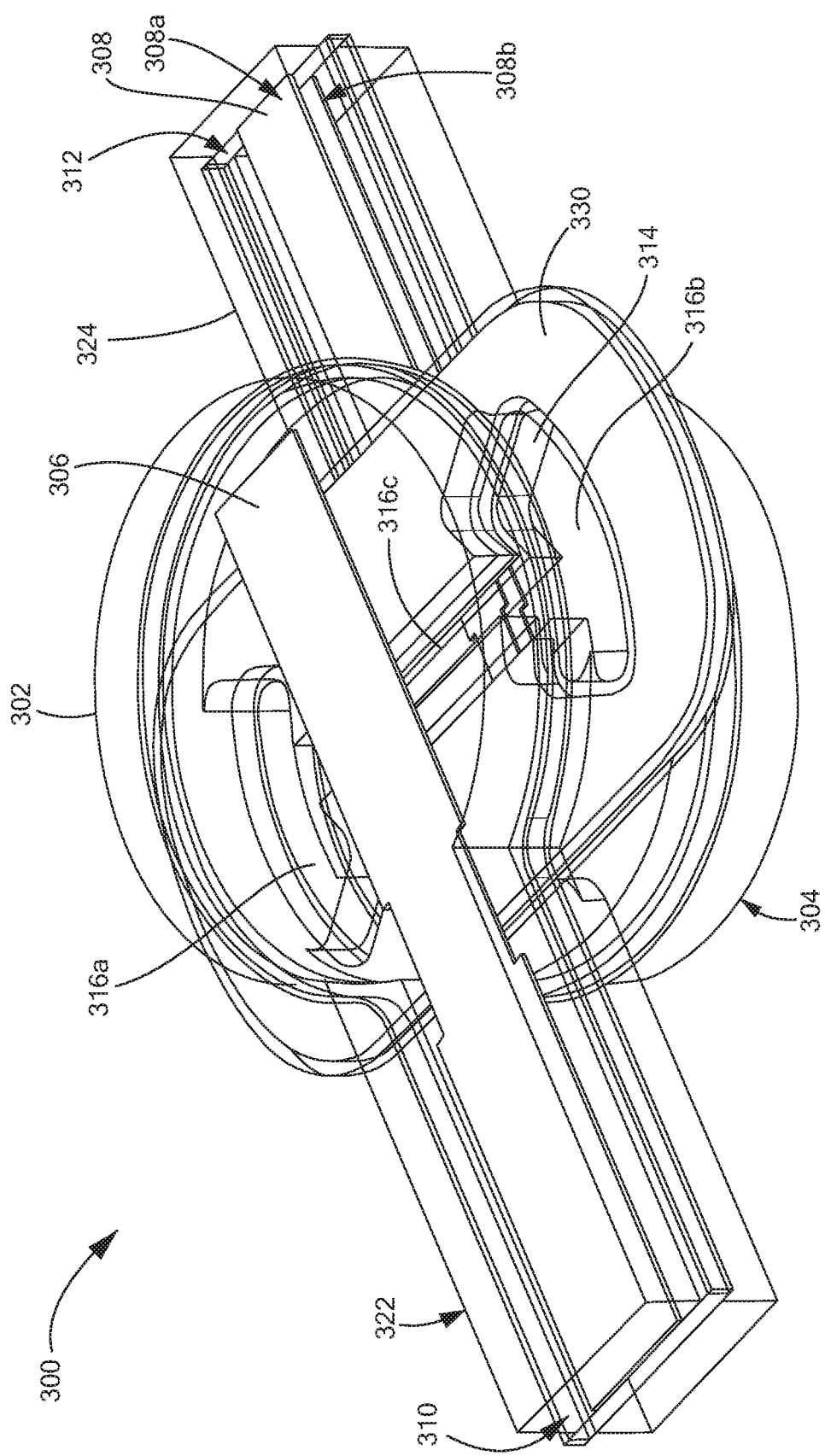
FIG. 3 is an isometric view illustrating a ridged waveguide of the RF interconnect system.

Now referring to FIGS. 3-3A, in which like elements are provided having like reference designations, an RF interconnect 300 includes an upper cavity 302, lower cavity 304 and a ridged waveguide 314. In an embodiment, both the upper cavity 302 and lower cavity 304 include a SAS transmission line conductor 306, 308, respectively. SAS transmission line conductors 306, 308 may be the same as or substantially similar to conductors 207, 227a, 227b described above with respect to FIG. 2. For example, upper cavity SAS transmission line conductor 306 may be disposed, applied to or otherwise formed on at least one surface of a substrate 310 within a waveguide structure 322. Lower cavity SAS transmission line conductor 308 may include two portions, a first portion disposed, applied to or otherwise formed on a first surface of a substrate 312 and a second portion disposed, applied to or otherwise formed on a second, opposing, surface of substrate 312. Lower cavity SAS transmission line conductor 308 may be disposed within waveguide structure 324. As illustrated in FIG. 3, a portion of both SAS transmission line conductors 306, 308 cross a slot 316 formed by ridged waveguide 314.

It should be appreciated each of the SAS transmission lines 306, 308 may be formed in a variety of different shapes and sizes to meet different a desired bandwidth range and/or size constraint. For example, in some embodiments, each of the SAS transmission lines 306, 308 may be formed such that at least a quarter wavelength of each crosses over or under slot 316 respectively.

Energy can be coupled between upper SAS transmission line conductor 306 and lower SAS transmission line conductor 308 through slot 316. For example, in some embodiments, upper SAS transmission line conductor 306 and lower SAS transmission line conductor 308 can be electromagnetically coupled through slot 316 to form an electromagnetic capability (EMC) transition.

Slot 316 may be formed in a variety of different shapes and have a variety of different dimensions (e.g., width, length). For example, and as illustrated in FIGS. 3-3A, slot 316 may include a dogbone slot (shaped similar to a dogbone shape, H-shape). The dogbone slot may include a first end 316a, second end 316b and a middle portion 316c to couple the first end 316a and second end 316b. In some embodiments, first end 316a and second end 316b may have the same dimensions. It should be appreciated that the shape and/or dimensions of slot 316 may be based at least in part on desired energy transfer properties (e.g., bandwidth) of RF interconnect 300 and/or size constraints of a system RF interconnect is utilized within.

Slot 316 may be sealed by an electromagnetic (EMI) gasket 330. In an embodiment, EMI gasket 330 can be configured to seal and protect slot 316 from electromagnetic interference.

Upper SAS transmission line conductor 306 and lower SAS transmission line conductor 308 can be positioned such that they separated by a predetermined distance. Thus, in some embodiments, there is no physical contact between upper SAS transmission line conductor 306 and lower SAS transmission line conductor 308. In such an embodiment, RF energy can be coupled (e.g., transferred) between upper SAS transmission line conductor 306 and lower SAS transmission line conductor 308 through slot 316. The predetermined distance may be based at least in part on size constraints of RF interconnect 300 and/or size constraints of a system RF interconnect is utilized within.

FIGS. 3-3A shows upper cavity 302 and upper SAS transmission line conductor 306 at a 180° orientation with respect to lower cavity 304 and lower SAS transmission line conductor 308, however it should be appreciated that other arrangements (e.g., 0° orientation) are possible.

Figure 4:
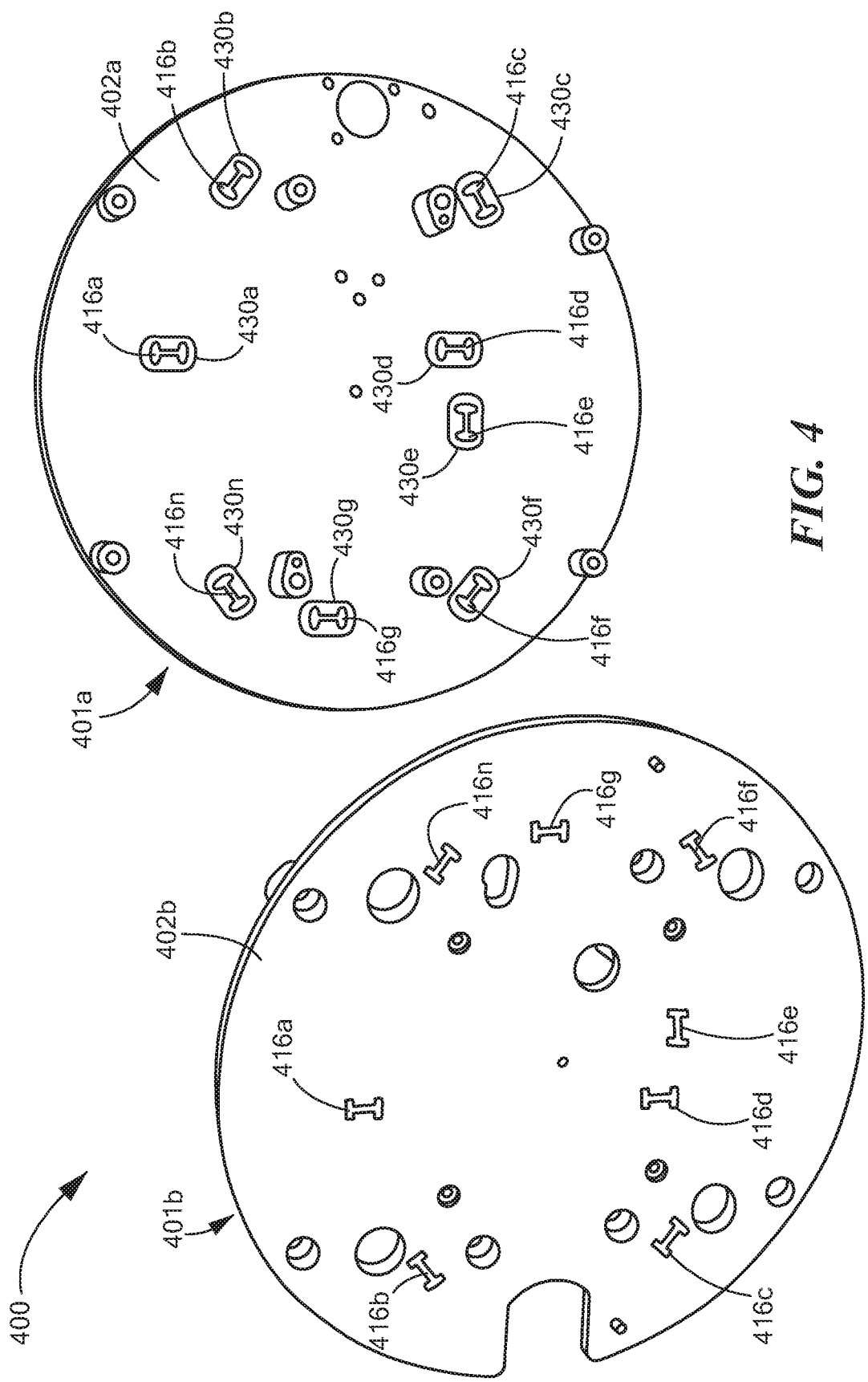
FIG. 4 are surface views illustrating slots and cavities in two opposing plates of an RF interconnect system.

Now referring to FIG. 4, an RF interconnect system 400 includes multiple slots 416a-416n formed on a first surface 402a and second surface 402b of plates 401a, 401b which form an RF interconnect system 400. In an embodiment, first surface 402a may be coupled to a receiver portion of an array antenna and second surface 402b may be coupled to an antenna portion of an array antenna. Each of slots 416-416n may be the same as or substantially similar to slot 116 of FIG. 1. Slot 214 of FIG. 2, and slot 316 of FIGS. 3-3A.

For example, RF interconnect system 400 may include a plurality of pairs of SAS transmission lines (not visible in FIG. 4). Each pair of transmission lines may be disposed such that each includes a substrate and conductor that crosses at least one of slots 416a-416n, opposite another SAS transmission line. The plurality of pairs of SAS transmission lines can be electromagnetically coupled through at least one of slots 416a-416n. Thus, RF interconnect system 400 may include a plurality of RF interfaces.

Each of slots 416a-416n may be used to transmit data corresponding to different measurements. For example, one or more slots 416a-416n may correspond to main quadrant output connections, an azimuth measurement connection, an elevation measurement connection, a summation measurement connection and a guard interface. In an embodiment, each of slots 416a-416 may have the same or substantially similar geometries and/or dimensions. In other embodiments, one or more of slots 416a-416 may different geometries and/or dimensions.

A sealing gasket 430a-430n may be disposed on or otherwise formed on each of the slots 416a-416n to seal the respective slot and protect the respective slot from electromagnetic interference. The sealing gaskets 430a-430n may be formed on one surface (here first surface 402a) or may be formed on both surfaces of RF interconnect 400.

A number of embodiments of the disclosure have been described. Nevertheless, it will be understood that various modifications may be made without departing from the spirit and scope of the disclosure. Elements of different embodiments described herein may be combined to form other embodiments not specifically set forth above. Other embodiments not specifically described herein are also within the scope of the following claims.

What is claimed:

1. A radio frequency (RF) interconnect comprising:
   a housing having a ridged waveguide portion provided therein;
   an upper cavity formed in an upper portion of said housing;
   a lower cavity formed in a lower portion of said housing;
   a first suspended air stripline (SAS) transmission line disposed in the lower cavity such that at least a portion of the first SAS transmission line crosses a slot formed by said ridged waveguide;
   a second SAS transmission line disposed in the upper cavity such that at least a portion of the second SAS transmission line crosses the slot formed by said ridged waveguide; and
   an electromagnetic interference (EMI) gasket disposed at an interface established between the first and the second SAS transmission line to electromagnetically seal the slot formed by said ridged waveguide.

2. The RF interconnect of claim 1, wherein the first SAS transmission line and the second SAS transmission line are separated by a predetermined distance.

3. The RF interconnect of claim 1, wherein the slot formed by said ridged waveguide forms an electromagnetic capability (EMC) transition between the first SAS transmission line and the second SAS transmission line.

4. The RF interconnect of claim 1, wherein the upper cavity and lower cavity each comprise dielectric material.

5. The RF interconnect of claim 4, wherein the upper cavity comprises different dielectric material than the lower cavity.

6. The RF interconnect of claim 1, wherein the upper cavity and the lower cavity each comprise one or more air gaps positioned relative to the slot formed by said ridged waveguide.

7. The RF interconnect of claim 1, wherein a dielectric constant of the upper cavity is equal to a dielectric constant of the lower cavity.

8. The RF interconnect of claim 1, wherein the first SAS transmission line comprises a plurality of vias to couple a first surface of the first SAS transmission line to a second surface of the first SAS transmission line.

9. The RF interconnect of claim 1, wherein the slot formed by said ridged waveguide includes a dog-bone slot.

10. A radio frequency (RF) interconnect comprising:
an antenna suspended air stripline (SAS) having a first and second opposing surfaces, the second surface having a first conductor and a first cavity, wherein the first cavity forms a first portion of a ridged waveguide;
a receiver SAS having a first and second opposing surfaces, the first surface having a second conductor and a second cavity, wherein the second cavity forms a second side of the ridged waveguide; and
an electromagnetic interference (EMI) gasket disposed at an interface established between the first cavity and the second cavity to electromagnetically seal a slot formed by the ridged waveguide,
wherein energy is transmitted between the antenna SAS and the receiver SAS through the ridged waveguide.

11. The RF interconnect of claim 10, wherein the first conductor and second conductor are separated by a predetermined distance from each other.

12. The RF interconnect of claim 10, wherein the coupling slot forms an electromagnetic capability (EMC) transition between the first conductor and the second conductor.

13. The RF interconnect of claim 10, wherein the antenna SAS and receiver SAS each comprise dielectric material.

14. The RF interconnect of claim 13, wherein the dielectric material in the antenna SAS is different than the dielectric material in the receiver SAS.

15. The RF interconnect of claim 10, wherein the antenna SAS and the receiver SAS each comprise one or more air gaps positioned relative to the ridged waveguide.

16. The RF interconnect of claim 10, wherein the second conductor of the receiver SAS comprises a plurality of vias to couple a first surface of the second conductor to a second surface of the second conductor.

17. A radio frequency (RF) interconnect comprising:
a first substrate having first and second opposing surfaces, the first substrate having a first plurality of cavities formed in the second surface, wherein each of the plurality of cavities form respective first sides of a corresponding plurality of ridged waveguides;
a first suspended air stripline (SAS) transmission line provided in the first substrate, with at least a portion of the first SAS transmission line extending into at least a portion of one of the first plurality of cavities;
a second substrate having first and second opposing surfaces with the first surface of the second substrate disposed over the second surface of the first substrate, the second substrate having a second, like plurality of cavities formed in the first surface, wherein each of the second plurality of cavities form respective second sides of a plurality of ridged waveguides such that with the first surface of the second substrate disposed over the second surface of the first substrate the plurality of first and second cavities in the respective first and second substrates form a plurality of ridged waveguides;
a second suspended air stripline (SAS) transmission line provided in the second substrate, with at least a portion of the second SAS transmission line extending into at least a portion of one of the second plurality of cavities; and
an electromagnetic interference (EMI) gasket disposed at an interface between one of the first and second cavities to electromagnetically seal at least one slot formed by the plurality of ridged waveguides,
wherein at least one of the plurality of ridged waveguides is configured to couple RF energy between the first SAS transmission line and the second SAS transmission line and wherein the first SAS transmission line and the second SAS transmission line are separated by a predetermined distance from each other.

* * * * *